United States Patent
Becker et al.

(10) Patent No.: US 7,811,941 B1
(45) Date of Patent: Oct. 12, 2010

(54) DEVICE AND METHOD FOR ETCHING A SUBSTRATE USING AN INDUCTIVELY COUPLED PLASMA

(75) Inventors: Volker Becker, Marxzell (DE); Franz Laermer, Stuttgart (DE); Andrea Schilp, Schwäbisch Gmünd (DE)

(73) Assignee: Robert Bosch GmbH, Stuttgart (DE)

( * ) Notice: Subject to any disclaimer, the term of this patent is extended or adjusted under 35 U.S.C. 154(b) by 806 days.

(21) Appl. No.: 09/762,985

(22) PCT Filed: Jun. 6, 2000

(86) PCT No.: PCT/DE00/01835

§ 371 (c)(1),
(2), (4) Date: May 8, 2001

(87) PCT Pub. No.: WO01/06539

PCT Pub. Date: Jan. 25, 2001

(30) Foreign Application Priority Data

Jul. 20, 1999   (DE) ............................... 199 33 842

(51) Int. Cl.
*H01L 21/311* (2006.01)
*C03C 15/00* (2006.01)

(52) U.S. Cl. ........................... 438/719; 216/67; 216/68; 216/79; 438/714

(58) Field of Classification Search .................. 438/714, 438/732, 719; 216/67, 68, 79, 80
See application file for complete search history.

(56) References Cited

U.S. PATENT DOCUMENTS

| | | | |
|---|---|---|---|
| 4,935,661 A | | 6/1990 | Heinecke et al. |
| 5,501,893 A | * | 3/1996 | Laermer et al. ............. 428/161 |
| 5,558,718 A | | 9/1996 | Leung |
| 5,567,268 A | * | 10/1996 | Kadomura ............. 156/345.28 |
| 5,662,819 A | * | 9/1997 | Kadomura ................... 438/711 |
| 5,683,538 A | | 11/1997 | O'Neill et al. |
| 5,779,925 A | | 7/1998 | Hashimoto et al. |
| 5,880,034 A | | 3/1999 | Keller |
| 5,928,528 A | | 7/1999 | Kubota et al. |
| 5,935,373 A | * | 8/1999 | Koshimizu ............. 156/345.28 |

(Continued)

FOREIGN PATENT DOCUMENTS

DE    42 41 045    3/1996

(Continued)

*Primary Examiner*—Luz L. Alejandro
(74) *Attorney, Agent, or Firm*—Kenyon & Kenyon LLP

(57) ABSTRACT

A method and a device suitable for implementing this method for etching a substrate (10), a silicon body in particular, using an inductively coupled plasma (14) are proposed. For this purpose, a radio-frequency electromagnetic alternating field is generated with an ICP source (13), the alternating field generating an inductively coupled plasma (14) of reactive particles in a reactor (15). The inductively coupled plasma (14) arises by the action of the radio-frequency electromagnetic alternating field on a reactive gas. Furthermore, a device is provided with which a plasma power injected into the inductively coupled plasma (14) via the radio-frequency electromagnetic alternating field with the ICP source (13) is capable of being pulsed so that at least from time to time a pulsed radio-frequency power can be injected into the inductively coupled plasma (14) as a pulsed radio-frequency power. In addition, the pulsed plasma power can be combined or correlated with a pulsed magnetic field and/or a pulsed substrate electrode power.

30 Claims, 4 Drawing Sheets

U.S. PATENT DOCUMENTS

| | | | | |
|---|---|---|---|---|
| 5,997,687 | A * | 12/1999 | Koshimizu | 156/345.44 |
| 6,020,794 | A * | 2/2000 | Wilbur | 333/17.1 |
| 6,085,688 | A * | 7/2000 | Lymberopoulos et al. | 118/711 |
| 6,217,785 | B1 * | 4/2001 | Collins et al. | 216/68 |
| 6,720,273 | B1 | 4/2004 | Becker et al. | |

FOREIGN PATENT DOCUMENTS

| | | |
|---|---|---|
| DE | 197 34 278 | 2/1999 |
| DE | 199 00 179 | 2/2000 |
| DE | 199 19 832 | 11/2000 |
| DE | 199 27 806 | 1/2001 |
| EP | 0 840 350 | 5/1998 |
| EP | 1 203 396 | 5/2002 |
| JP | 8088218 | 4/1996 |
| JP | 8-222549 | 8/1996 |
| JP | 9-55347 | 2/1997 |
| JP | 10 064696 | 3/1998 |
| JP | 10079372 | 3/1998 |
| JP | 11-26433 | 1/1999 |
| WO | WO 97 14177 | 4/1997 |
| WO | WO 98/37577 | 8/1998 |
| WO | WO 00/79579 | 12/2000 |
| WO | WO 01/06540 | 1/2001 |

* cited by examiner

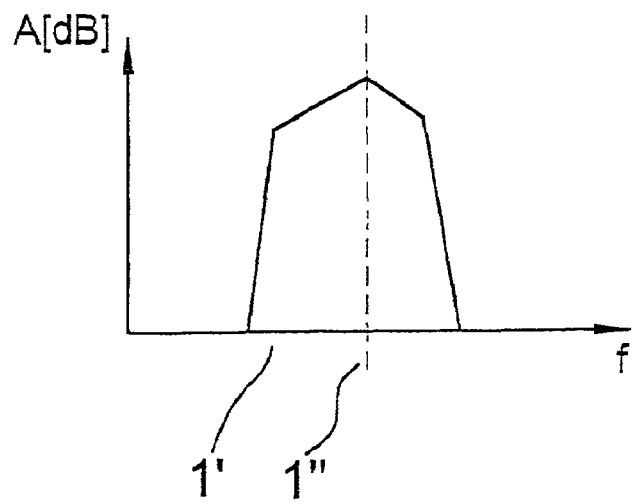
FIG. 3
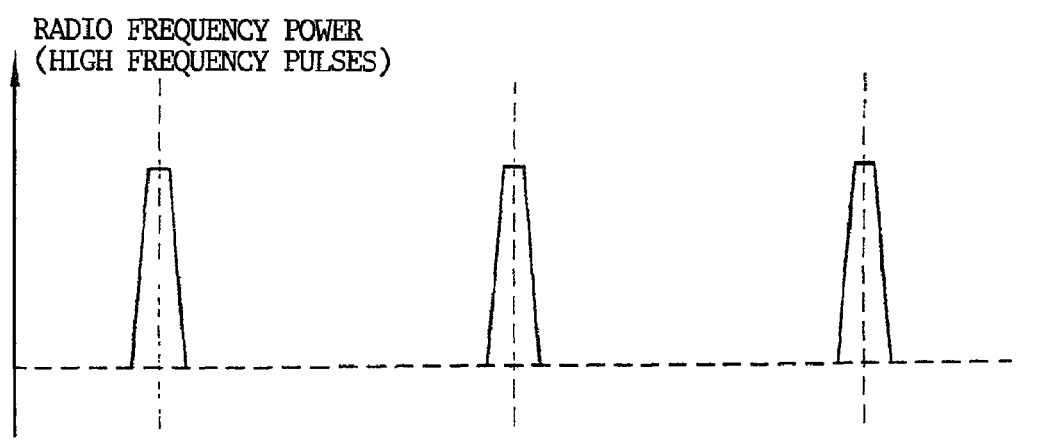
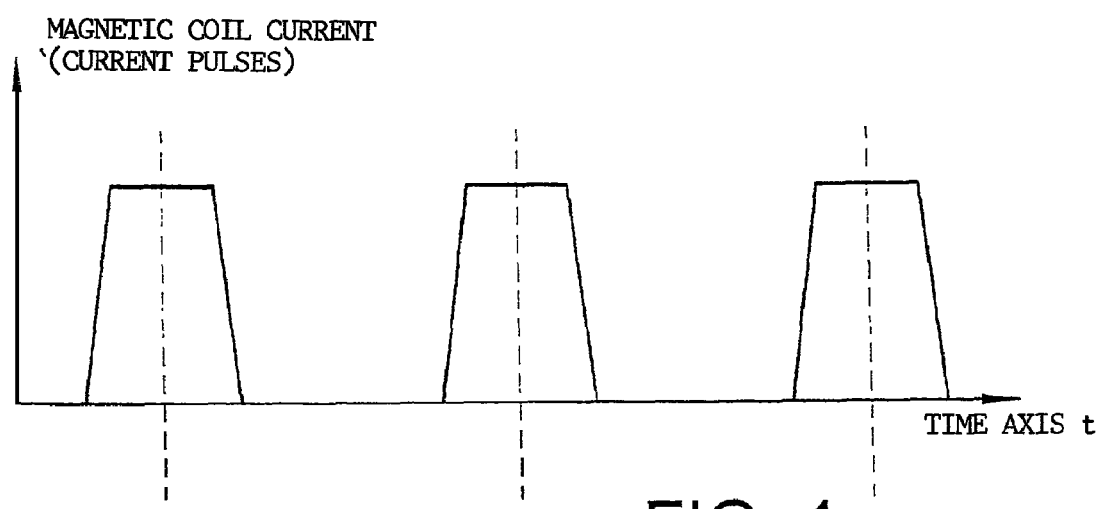
FIG. 4

DEVICE AND METHOD FOR ETCHING A SUBSTRATE USING AN INDUCTIVELY COUPLED PLASMA

FIELD OF THE INVENTION

The invention relates to a device and a method which can be implemented with it for etching a substrate, a silicon body in particular, using an inductively coupled plasma according to the species of the independent claims.

DESCRIPTION OF RELATED ART

In order to implement an anisotropic high-rate etching method, for silicon for example, using an inductive plasma source, in methods such as those known from German Patent 42 41 045 C2, for example, it is necessary to bring about an efficient sidewall passivation in the shortest possible time during passivation steps and moreover to achieve as high a concentration as possible of silicon-etching fluorine radicals during etching steps. In order to increase the etching rate, an obvious step is to work with maximally high radio-frequency powers at the inductive plasma source and as a result, to inject maximally high plasma powers into the produced inductively coupled plasma.

However, these injectable plasma powers are subject to limits resulting firstly from the load carrying capacity of the electrical components and secondly from the nature of the process. Consequently, high radio-frequency powers of the inductive plasma source, i.e., high plasma powers to be injected, intensify harmful electrical effects from the source area on the produced inductively coupled plasma which adversely affect the etching results on the substrate wafer.

In addition, in etching processes of the type described in German Patent 42 41 045 C2, with very high plasma powers, stability problems also occur in injecting the plasma during the switching phases between etching and passivation steps. This stems from the fact that power reflection and overvoltage occurring with high powers in the kilowatt range to be injected during the switching phases have a destructive effect on the electrical circuit of the plasma source (coil, connected capacitors, generator output stages, etc.).

An inductive plasma source which has already been further developed in relation to German Patent 42 41 045 C2 is described in German Patent Application 199 00 179, this plasma source being suitable for particularly high plasma powers by virtue of a loss-free symmetrical radio-frequency feeding of the coil of the inductive plasma source and generating an inductive plasma which is particularly low in injected disturbances. However, for this source type as well, the practicable power limit ranges from approximately 3 kilowatts to 5 kilowatts, above which the required radio-frequency components become extremely expensive or problems with regard to plasma stability become excessive.

German Patent Application 199 198 32 further makes known a method in which the plasma power injected into an inductively coupled plasma having a radio-frequency electromagnetic alternating field is varied adiabatically between individual procedure steps, alternating etching and passivation steps in particular.

Such an adiabatic power transition, i.e., a gradual increase or reduction of the injected plasma power, with simultaneous continuous matching of the impedance of the ICP source to the particular plasma impedance as a function of the injected plasma power via an automatic matching network or an impedance transformer (matchbox) makes it possible to control the above-mentioned problems with regard to power reflection and overvoltage when switching plasma powers ranging from 1 kilowatt to 5 kilowatts on and off. However, a typical duration of the closing operations ranges from 0.1 seconds to 2 seconds. Faster changes in power are not possible with this approach.

SUMMARY OF THE INVENTION

In contrast to the known methods, the device according to the present invention and the method implemented with it has the advantage that a variably adjustable, pulsed radio-frequency power is generated with it which can be injected into the inductively coupled plasma as a plasma power, it being possible for the pulsing of the plasma power to take place very rapidly, within microseconds for example, and simultaneously being combined with power changes of several thousand watts.

In addition, the implemented pulsing of the plasma power is associated with an essential improvement in the efficiency of the ICP source and opens up the possibility to reduce the mean plasma power without a reduction in the etching rate or to increase the etching rate with an unaltered mean plasma power. Moreover, pulsing of the plasma power makes it possible to effectively reduce electrical disturbance effects from the source area of the ICP source.

Advantageous refinements of the invention result from the measures named in the dependent claims.

It is thus particularly advantageous if the plasma etching system according to the present invention is provided with a balanced, symmetrically designed and symmetrically supplied configuration of the ICP source. In this manner the homogeneity of the etching rates over the surface of the substrate is distinctly improved and the electrical injection of high plasma powers into the plasma generated is considerably simplified.

Moreover, it is advantageous if an additional, constant or chronologically varying longitudinal magnetic field is generated in the interior of the reactor, the magnetic field guiding the generated, inductively coupled plasma as a type of magnetic cylinder from the plasma source to the substrate to be etched.

This magnetic field, whose direction is at least approximately or predominantly parallel to the direction defined by the connecting line of the substrate and inductively coupled plasma, distinctly improves the utilization of the injected radio-frequency power to produce the desired plasma species (electrons, ions, free radicals), i.e., the efficiency of plasma generation. Therefore, distinctly higher etching rates are additionally possible with the same plasma power.

A particularly good guidance of the generated plasma through the magnetic field and a particularly low feedthrough of the generated magnetic field onto the substrate to be etched itself is advantageously brought about if an aperture arranged concentrically to the interior wall of the reactor is additionally provided, the aperture preferably being arranged approximately 5 cm above the substrate arranged on a substrate electrode. This aperture results in an improved uniformity of the etching over the substrate surface and simultaneously prevents high induced voltages in the substrate to be etched in the case of a magnetic field varying over time, which could possibly result in damage to electronic components.

Moreover, it is very advantageous if components are integrated in the ICP coil generator that bring about a variation of the frequency of the generated electromagnetic alternating field for the impedance matching as a function of the plasma power to be injected since this results in particularly rapid switching between plasma power pulses and interpulse periods.

These frequency variations advantageously result in the avoidance of occasional high reflected powers back into the ICP coil generator when the plasma power is pulsed, in particular in times of a rapidly changing injected plasma power, i.e., in pulse to pause transitions. An additional essential advantage of an optimum impedance matching at any time via a variable frequency of the radio-frequency power of the ICP coil generator is that this frequency change can be performed very rapidly since it is only limited by the control rate of the electronic circuit performing the frequency variation. Thus response times or very fast power changes of the output power of the ICP coil generator are possible in a stable manner in the microsecond range, which makes it possible to work with plasma power pulses, the duration of which is in the microsecond range, during the etching and/or passivation steps.

Since very rapid impedance changes occur in the plasma with pulsed operation of the ICP source, according to the previous related art methods with individual pulse powers in the kilowatt range, in particular in the range above 3 kilowatts, it has been impossible to avoid the occurrence of high reflected power when switching the injected radio-frequency pulses on and off or to at least render them harmless. In contrast, the device according to the present invention ensures the impedance matching of the inductively coupled plasma or ICP source and ICP coil generator at any time, even in this case.

In contrast to continuous operation, pulsed operation of the ICP source has the further essential advantage that an essentially higher plasma density is attained during the radio-frequency power pulses or plasma power pulses than with continuous operation. This is based on the fact that generation of an inductive plasma is to a high degree a non-linear process so that the mean plasma density in this pulsed operation is higher than with a mean plasma power corresponding to the time average. Therefore, effectively more reactive species and ions are obtained over the time average in pulse operation than in continuous operation. This applies in particular when "giant pulses" are used, i.e., relatively short and extremely powerful radio-frequency power pulses of, for example, 20 kilowatts peak power, as is now possible with the device of the invention, the mean plasma power over the time average then being only 500 watts, for example.

Moreover, unavoidable heat losses in the ICP coil generator and other system components of the plasma etching system are advantageously correlated with the relatively low plasma power over the time average in this case, while desired plasma effects, the obtainable etching rates in particular, advantageously correlate with the occurring peak powers. Consequently, the efficiency of the generation of reactive species and ions is distinctly improved.

A further advantage of a pulsed operation of the ICP source is that disturbing electrical charges on the substrate to be etched can be discharged during the pauses between the radio-frequency power pulses and consequently profile control during etching is improved as a whole.

Finally, it is very advantages if the pulsing of the generated magnetic field is correlated chronologically or synchronized with the pulsing of the injected plasma power and/or the pulsing of the radio-frequency power injected into the substrate via the substrate voltage generator. Thus the chronological synchronization of the pulsing of the magnetic field and injected plasma power in particular brings about a distinct reduction of the ohmic heat losses occurring in the magnetic field coil, which mitigates problems of cooling and temperature control of the magnetic field coil.

If, for example, the injected plasma power is operated at a pulse to pause ratio of 1:20, the current through the magnetic field coil can also be pulsed, for example, at a pulse to pause ratio of 1:18, advantageously resulting in a reduction of the required heat transfer from the magnetic field coil to $\frac{1}{18}$ of the original value. Simultaneously, the consumption of electrical power is also reduced accordingly.

BRIEF DESCRIPTION OF THE DRAWINGS

Exemplary embodiments of the present invention are explained with reference to the drawings and in the following description.

FIG. 3 shows an example of a filter characteristic,

FIG. 4 shows an example of a chronological synchronization of radio-frequency plasma power pulses with magnetic field pulses.

DETAILED DESCRIPTION OF THE INVENTION

Figure 1:
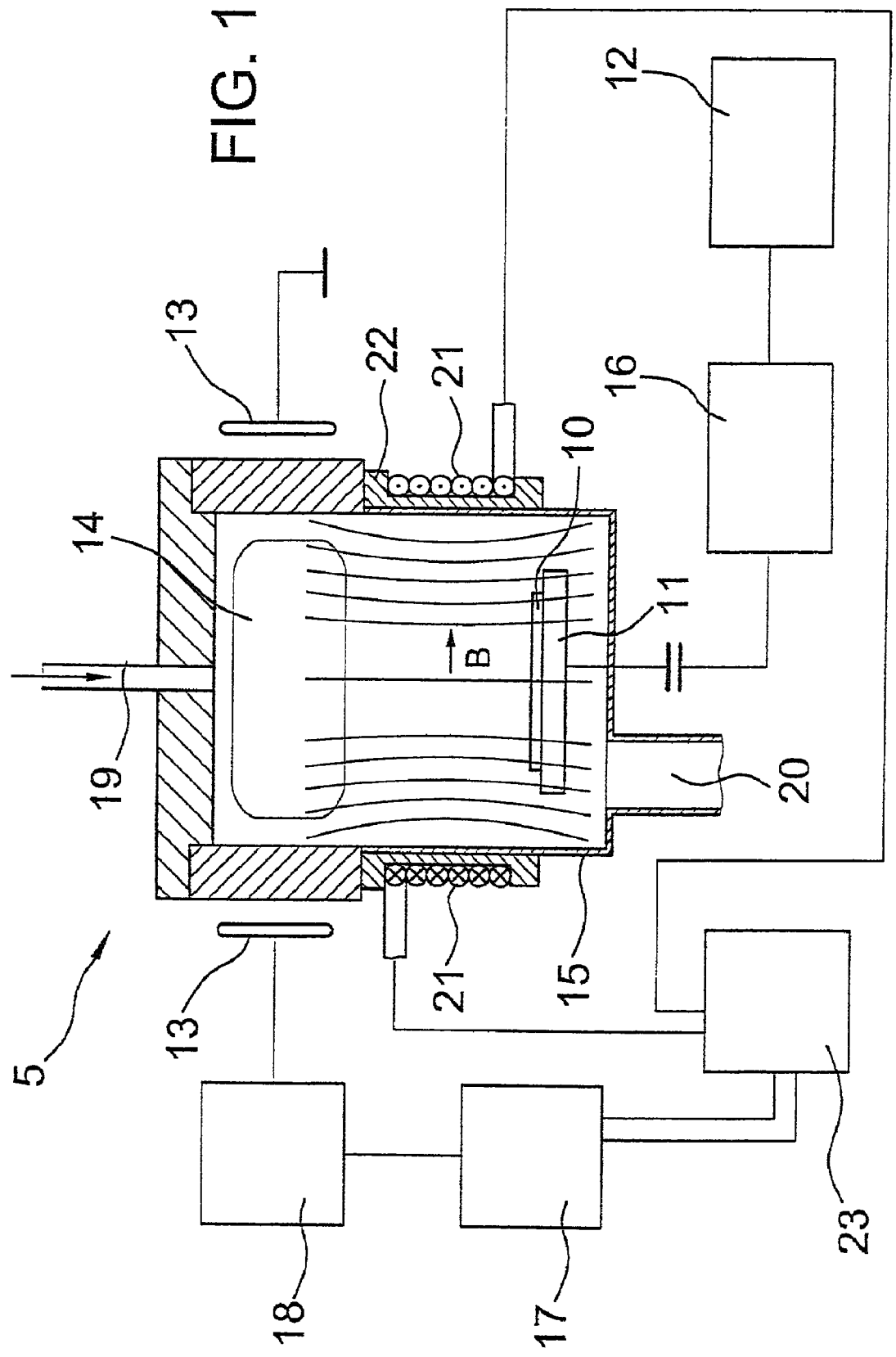
FIG. 1 shows a schematic view of a plasma etching system.

A first exemplary embodiment of the present invention is explained in greater detail with reference to FIG. 1. For this purpose, a plasma etching system 5 first has a reactor 15, in whose upper area an inductively coupled plasma 14 is generated in a manner known per se via an ICP source 13 (inductively coupled plasma). Additionally provided are a gas supply 14 for the supply of a reactive gas such as $SF_6$, $ClF_3$, $O_2$, $C_4F_8$, $C_3F_6$, $SiF_4$ or $NF_3$, a gas discharge 20 for the discharge of reaction products, a substrate 10, for example, a silicon body or silicon wafer to be structured using the etching method of the present invention, a substrate electrode 11 being in contact with substrate 10, a substrate voltage generator 12, and a first impedance transformer 16. Substrate voltage generator 12 injects a high-frequency AC voltage into substrate electrode 11 and through it into substrate 10, the high-frequency AC voltage bringing about an acceleration of ions produced in inductively coupled plasma 14 onto substrate 10. The radio-frequency power or AC voltage injected into substrate electrode 11 is typically between 3 watts and 50 watts and 5 volts and 100 volts, respectively, in continuous operation and in pulsed operation, respectively, each in the time average over the pulse sequence.

In addition, an ICP coil generator 17 is provided which is connected to a second impedance transformer 18 and via it to ICP source 13. Thus ICP source 13 generates a radio-frequency electromagnetic alternating field and via it an inductively coupled plasma 14 of reactive particles and electrically charged particles (ions) in reactor 15 which are generated by the action of the radio-frequency electromagnetic alternating field on the reactive gas. For this purpose, ICP source 13 has a coil having at least one turn.

Second impedance transformer 18 is preferably designed in the manner proposed in German Patent Application 199 00 179.0 resulting in a balanced, symmetrically structured configuration and supply of ICP source 13 via ICP coil generator 17. Thus it is ensured in particular that the high-frequency AC voltages applied to both ends of the coil of ICP source 13 are at least nearly in phase opposition to each other. In addition, center tap 26 of the coil of ICP source 13 is, as is suggested in FIG. 2, preferably grounded.

Moreover, the anisotropic high-rate etching process for silicon with alternating etching and passivation steps, which is known from German Patent 42 41 045 C2, is carried out with plasma etching system 5. With regard to additional details concerning plasma etching system 5, which are known per se to a person skilled in the art, and the associated etching method, in particular with regard to the reactive gases, the process pressures and the substrate electrode voltages in the respective etching steps and passivation steps, the reference is therefore made to German Patent 42 41 045 C2.

In other respects, plasma etching system 5 of the present invention is also suited for a process control as described in German Patent Application 19927806.7.

In particular, when substrate 10 is etched during the passivation steps, passivation is carried out in reactor 15 with a process pressure of 5 μbar to 20 μbar and at a mean plasma power of 300 to 1000 watts injected into plasma 14 via ICP source 13. Examples of suitable passivation gases are $C_4F_8$ or $C_3F_6$. During the subsequent etching steps, etching is then carried out at a process pressure of 30 μbar to 50 μbar and at a high mean plasma power of 1000 to 5000 watts. Examples of suitable reactive gases are $SF_6$ or $ClF_3$. For the purposes of the invention, mean plasma power is understood to be a coupled plasma power time averaged over a large number of plasma power pulses.

In addition, a spacer 22 of a non-ferromagnetic material such as aluminum is placed in plasma etching system 5 between inductively coupled plasma 14, i.e., ICP source 13, i.e., the actual plasma excitation zone, and substrate 10. This spacer 22 is inserted concentrically into the wall of reactor 15 as a spacer ring and thus forms the reactor wall in some areas. It has a typical height of approximately 5 cm to 30 cm for a typical reactor 15 diameter of 30 cm to 100 cm.

In a preferred form of the exemplary embodiment, spacer 22 is further surrounded by a magnetic field coil 21 which has, for example, 100 to 1000 turns and is wound from an enameled copper wire which is dimensioned to be of adequate gage for the current intensity to be used. In addition, copper tubes may be included in magnetic field coil 21 through which coolant water flows to remove heat losses from magnetic field coil 21.

As an alternative, it is also possible to wind magnetic field coil 21 itself from a thin copper tube enameled with an electrically insulating material, coolant water flowing directly through the copper tube.

An electrical current of, for example, 10 to 100 amperes is further conducted through magnetic field coil 21 via a power supply unit 23.

In the first embodiment explained, this is, for example, a direct current which generates a static magnetic field in the interior of reactor 15, which in the case of a magnetic field coil 21 with 100 turns, a length of 10 cm, and a diameter of 40 cm, generates, for example, a magnetic field strength in the center of magnetic field coil 21 of approximately 0.3 mTesla/A current flow.

To ensure a significant increase of the plasma generation efficiency and adequate magnetic conduction of inductively coupled plasma 14, magnetic field strengths of 10 mT to 100 mT are needed, 30 mT for example. This means that power supply unit 23 supplies current intensities of approximately 30 to 100 amperes at least during the etching steps for etching a substrate 10.

Incidentally, a permanent magnet may also be used instead of magnetic field coil 21. Such a permanent magnet advantageously requires no energy; however, it has the disadvantage that it is impossible to adjust the magnetic field, as would be of advantage for setting an optimum etching process. Moreover, the field strength of a permanent magnet is temperature-dependent, so that magnetic field coil 21 is preferred.

In any case, it is important for the direction of the magnetic field generated via magnetic field coil 21 or the permanent magnets to be at least approximately or predominantly parallel to the direction defined by the connecting line of substrate 10 and inductively coupled plasma 14, i.e., the plasma excitation zone (longitudinal magnetic field orientation).

Moreover, in an additional advantageous form of the explained exemplary embodiment, in order to improve the uniformity of the etching process, an aperture known from German Patent 197 34 278 is provided in the interior of reactor 15 concentric to the reactor wall between ICP source 13, i.e., the plasma excitation zone, and substrate 10. This aperture is not shown in FIG. 1 for reasons of clarity. Preferably, it is attached to spacer 22 approximately 5 cm above substrate electrode 11 or substrate 10.

In addition, in the event a magnetic field coil 21 is used, a suitable monitoring device, which is known per se, must be integrated in power supply unit 23, the monitoring device being incorporated in the process control and monitoring the coil temperature and performing an emergency shutdown in the event of a coolant water failure, for example.

In addition, during the etching steps and/or during the passivation steps, ICP coil generator 17 injects a pulsed plasma power into inductively coupled plasma 14 which, on a time average, is between a minimum of 300 watts and a maximum of 5000 watts. Preferably, on a time average, 2000 watts are injected during the etching steps and 500 watts during the passivation steps.

In order too make the pulsing of the injected plasma power possible, it is further provided that during the pulsing, the impedance of the radio-frequency power generated via ICP coil generator 17 is continuously matched to the plasma impedance which changes as the plasma power is changed, i.e., pulsed. For this purpose, the frequency of the radio-frequency electromagnetic alternating field generated by ICP coil generator 17 is varied for impedance matching within a specified bandwidth.

In particular, the preferably symmetrically designed adaptor network in the second impedance transformer 18 which feeds ICP source 13 symmetrically is initially adjusted for this purpose in such a way that the best possible impedance matching is always present when the injected radio-frequency plasma power pulses have reached their maximum value. Typical maximum values are between 3 kilowatts and 20 kilowatts at a pulse to pause ratio of 1:1 to 1:10.

In addition, the frequency variation of the coupled electromagnetic alternating field takes place in such a way that when the maximum values of the radio-frequency plasma power pulses are attained, stationary or resonance frequency 1" of the radio-frequency electromagnetic alternating field generated by ICP coil generator 17 is attained simultaneously. Stationary frequency 1" is preferably 13.56 MHz.

The frequency of the electromagnetic alternating field is varied around stationary frequency 1" when the plasma power is pulsed in order to ensure that when the plasma power is pulsed, there is always an at least extensive matching of the impedance of the generated radio-frequency power, i.e., of ICP coil generator 17 to the impedance of plasma 14 which changes over time as a function of the plasma power. For this purpose, the frequency of ICP coil generator is enabled within a specific bandwidth around stationary frequency 1" and is varied within this bandwidth for impedance matching by an electronic control.

This frequency variation is explained with the aid of FIG. 3 in which a filter characteristic 1' is shown which specifies a preset frequency range (bandwidth) within which the frequency of ICP coil generator 17 is varied, each frequency being assigned a specific radio-frequency power, i.e., a plasma power to be injected, respectively, or an attenuation A of the output of ICP coil generator 17. The frequency to be attained in the stationary power case is stationary frequency 1" which is at least approximately present if the particular maximum power of the pulse is attained during a plasma power pulse.

Figure 2:
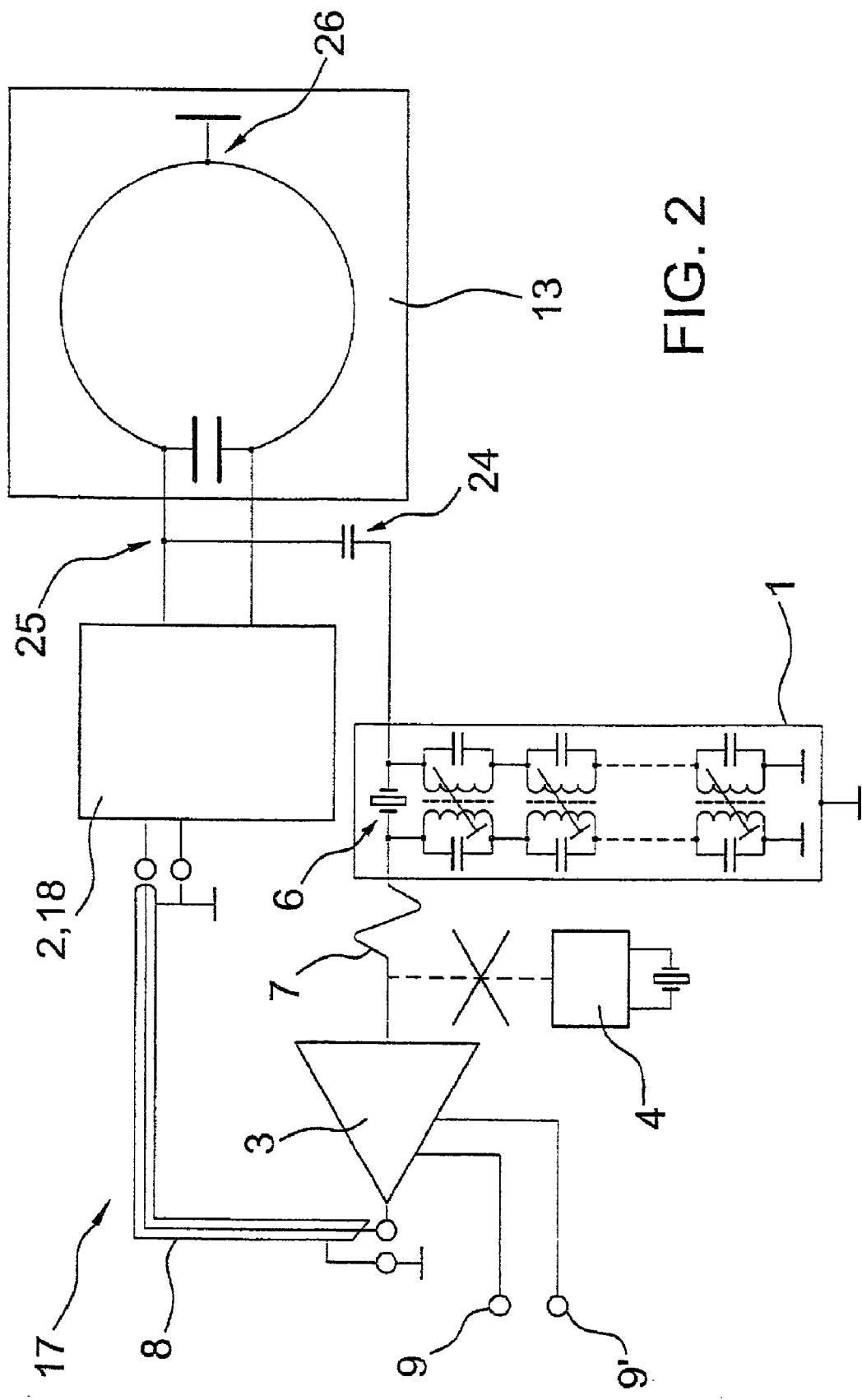
FIG. 2 shows an electronic feedback circuit with a connected ICP source.

Further details of a suitable electronic circuit for impedance matching by frequency variation in the form of an automatically operating feedback circuit are explained with the aid of FIG. 2. ICP source 13, i.e., specifically its coil, is initially supplied by a preferably balanced symmetrical matching network 2 from an unbalanced asymmetrical output of ICP coil generator 17 in a manner known per se from German Patent 199 00 179. Matching network 2 is a part of the second impedance transformer 18. In addition, ICP coil generator 17 has a radio-frequency power amplifier 3 and a quartz oscillator 4 for generating a high-frequency fundamental component with a fixed frequency of, for example, 13.56 MHz.

In the related art methods, the radio-frequency fundamental component of quartz oscillator 4 is normally supplied to the amplifier input of power amplifier 3. However, this supply is first modified to the effect that quartz oscillator 4 is first isolated from the amplifier input of power amplifier 3 at least during the power change phases and its input is made accessible externally, for example, via a matching input socket. Since quartz oscillator 4 no longer has a function in this embodiment, it may also be suitably deactivated.

In other respects, in the stationary case, i.e., after completion of a power variation, it is also possible to switch quartz oscillator 4 back to the amplifier input and to isolate the external feedback circuit. This makes it possible to implement an electrically very rapid switchover between an internal oscillator and an external feedback circuit depending on whether the generator output power is momentarily stationary or is in the process of change.

In addition, power amplifier 3 has in a known manner generator control inputs 9 which are used for externally controlling ICP coil generator 17. They can be used, for example, to switch ICP coil generator 17 on and off or to specify a radio-frequency power to be generated for injecting into plasma 14. Moreover, generator status outputs 9' are provided for the feedback of generator data such as generator status, present output power, reflected power, overload, etc. to an external control unit (machine control), which is not shown, or to power supply unit 23 of plasma etching system 5.

The amplifier input of power amplifier 3 is now connected with ICP source 13 via a frequency-selective component 1 used as a feedback circuit at least occasionally, i.e., during power change phases. In addition, capacitors, inductors and resistors or combinations of the same may be connected and provided as voltage dividers in a manner known per se in order to attenuate the high voltages occurring at the coil of ICP source 13 to a degree suitable as an input quantity for frequency-selective component 1 or the amplifier input of power amplifier 3. Such voltage dividers are essentially known and are only suggested in FIG. 2 by a decoupling capacitor 24 between the coil of ICP source 13, i.e., a signal tap, and frequency-selective component 1. It is also possible as an alternative to locate signal tap 25 in the vicinity of grounded center point or center tap 26, shown in the drawing, of the coil of ICP source 13 where correspondingly lower voltage levels prevail. Depending on the distance of signal tap 25, which may be designed, for example, as an adjustable clamping contact, from grounded center tap 26 of the coil of ICP source 13, a greater or smaller tapped voltage may be set, thus attaining favorable level ratios.

Frequency-selective component 1 is shown, for example, as a tunable arrangement of coils and capacitors, known as LC resonance circuits, which together form a band filter. As a passband, this band filter has a certain specified bandwidth of, for example, 0.1 MHz to 4 MHz and a filter characteristic 1', as is shown schematically in FIG. 3.

In particular, the band filter has a resonance frequency or stationary frequency 1" with maximum signal transmission. In the example explained, this stationary frequency 1" amounts to 13.56 MHz and can be set exactly in particular by a quartz oscillator 6 or a piezoceramic filter element as an additional component of the band filter. In other respects, instead of LC resonance circuits, it also possible to combine piezoceramic filter elements or other frequency-selective components, which are known per se, instead of LC resonance circuits, into a band filter having a desired filter characteristic, bandwidth and stationary frequency 1".

The above-described arrangement of controlled power amplifier 3, matching network 2, ICP source 13, and band filter as a whole represents a feedback circuit of the type of a Meissner oscillator. In operation, it first begins to oscillate in the vicinity of stationary frequency 1" in order to escalate to a specified output power of power amplifier 3. The phase relationship between the generator output and signal tap 25 required for the start of oscillation is set in advance one time, for example, via a delay line 7 of defined length and accordingly via a phase shift defined by the signal transit time or a phase shifter known per se instead of delay line 7. Thus it is always ensured that the coil of ICP source 13 is deattenuated in an optimum manner with a correct phase.

Via delay line 7, it is further ensured that the driving electrical voltage and the current in the coil of ICP source 13 have a resonance phase of approximately 90° with respect to each other at the location of ICP source 13.

Moreover, in practice, the resonance condition of the feedback circuit via frequency-selective component 1 is not stringent, so that a slight frequency shift in the vicinity of resonance frequency or stationary frequency 1" is often adequate to correct the resonance condition with respect to the phase virtually automatically. Therefore it is adequate to correct the resonance condition via the external connection only approximately so that the resonance circuit begins to oscillate somewhere in the immediate vicinity of its stationary frequency 1".

However, should all phase shifts from signal tap 25 of the coil of ICP source 13 via the band filter into the input of power amplifier 3 and via the power amplifier to second impedance transformer 18 back into the coil of ICP source 13 add up so unfavorably that the resonance circuit is in fact attenuated instead of being deattenuated, the system cannot begin to oscillate. The feedback then becomes an undesirable negative feedback instead of the desired positive feedback. The setting of this at least approximately correct phase is performed by delay line 7, whose length must therefore be set once for plasma etching system 5 so that the feedback has a constructive, i.e., deattenuating effect.

On the whole, in the event of incorrect matching to the plasma impedance, for example, during rapid power changes, the frequency of the explained feedback circuit can drop back within the passband of the band filter and thus constantly maintain a largely optimum impedance matching even with rapid impedance changes of inductively coupled plasma 14. During such rapid power changes, the explained feedback circuit is always activated and internal oscillator 4 of generator 17 is deactivated.

As soon as inductively coupled plasma 14 is then stabilized with regard to the plasma impedance and the injected plasma power, i.e., the frequency of ICP coil generator 17 returns to the vicinity or to the value of the maximum pass band frequency which is set by stationary frequency 1". This matching of the impedance by frequency variation occurs automatically and very rapidly within few oscillation periods of the radio-frequency AC voltage generated by the ICP coil generator, i.e, in the microsecond range.

The connection between the output of power transformer 3 and the input of second impedance transformer 18 is established by line 8, which is designed as a coaxial cable and is capable of carrying a power of several kilowatts.

In order now to inject a pulsed plasma power into the inductively coupled plasma, the output power of ICP coil generator 17 is switched on and off, i.e., pulsed, periodically, for example, with a repetition frequency of typically 10 Hz to 1 MHz, preferably 10 kHz to 100 kHz.

As an alternative, the amplitude of the envelope curve of ICP coil generator 17 output voltage may be modulated with a suitable modulation voltage. Such devices for amplitude modulation are sufficiently well-known from the high-frequency technology. For this purpose, for example, generator control input 9 is used for defining the setpoint of the radio-frequency power of ICP coil generator 17 in order thereby to supply the signal which modulates the radio-frequency power of ICP coil generator 17.

Of course, ICP coil generator 17 and the other components of plasma etching system 5 which are affected when the plasma power is pulsed must be designed in such a way that they must also be able to process the occurring peak loads (peak currents and voltages) without damage. Due to the high peak voltages at the inductive coil, the balanced supply of ICP source 13 has a particularly advantageous effect on obtaining favorable plasma properties.

Typical pulse to pause ratios, i.e., the ratio of the duration of the pulses to the duration of the pulse pauses, in the explained plasma etching process with pulsed plasma power are incidentally between 1:1 and 1:100. The amplitude of the individual radio-frequency pulses for the generation of the plasma power pulses is advantageously between 500 watts and 20,000 watts, preferably approximately 10,000 watts, the mean plasma power being set, for example, by setting the pulse to pause ratio.

As a refinement of the embodiment explained above, an additional exemplary embodiment provides that the magnetic field generated via magnetic field coil 21 is also pulsed. In this connection, however, it should be emphasized that, while the use of a constant or pulsed magnetic field is in fact advantageous for the method of the present invention for plasma etching with plasma power pulses, it is not compulsory. Depending on the individual case, an additional magnetic field may also be omitted.

In a particularly preferred manner, the pulsing of the magnetic field, which is brought about in a simple manner via suitable current pulses generated by power supply unit 23, occurs in such a way that the magnetic field is only generated when a radio-frequency power pulse is also present simultaneously for generating and injecting plasma power into inductively coupled plasma 14 at ICP source 13. As long as no plasma power is injected or no plasma is excited, as a rule, no magnetic field support is required either.

Such a time synchronization of radio-frequency power pulses for injecting plasma power into plasma 14 and current pulses through magnetic field coil 21 is explained with the aid of FIG. 4. The coil current through magnetic field coil 21 is always switched on shortly before a radio-frequency power pulse and switched off again shortly after the end of this pulse. The time synchronization of the current and plasma power pulses can be ensured in a simple manner, for example, by a pulse generator which is integrated in power supply unit 23 and is known per se, the pulse generator being provided with additional timer elements in order to apply the plasma power pulse with a specific delay of, for example, 10% of the set radio-frequency pulse duration after the power of magnetic field coil 21 is switched on or to switch this current off again with a specific delay of, for example, 10% of the set radio-frequency pulse duration after the end of the plasma power pulse. For this purpose, a further connection from power supply unit 23 and ICP coil generator 17 is provided. Such synchronization circuits and corresponding timer elements for the production of the necessary time delays are generally well-known. For this purpose, power supply unit 23 is additionally connected to ICP coil generator 17. In other respects, it should be emphasized that the duration of a current pulse through magnetic field coil 21 is advantageously always somewhat longer than the duration of a plasma power pulse.

Typical repetition rates or pulse rates depend on the inductance of magnetic field coil 21 which limits the rate of change of the coil current. A repetition rate of some 10 Hz to 10 kHz is, depending on its geometry, realistic for most magnetic field coils 21. Typical pulse to pause ratios for the plasma power pulses are between 1:1 and 1:100.

In this connection, the aperture known from German Patent 197 34 278.7 and already explained above is provided beneath magnetic field coil 21 several centimeters above substrate 10 or substrate electrode 11 which supports substrate 10. This aperture improves the uniformity of the etching over the substrate surface, in particular with a symmetrically supplied ICP source 13. At the same time, it also reduces the time-variable magnetic field—the transients—at the site of substrate 10. In this connection, eddy currents in the aperture ring of the aperture result in an attenuation of the time-variable magnetic field components immediately upstream from substrate 10 so that induction processes on substrate 10 itself are attenuated.

Such changing magnetic fields, known as transients, could induce voltages on antenna structures on substrate 10 which could in turn result in damage to substrate 10 if it has, for example, integrated circuits or field-effect transistors in particular.

As a refinement of the above embodiment, an additional exemplary embodiment provides that in addition to the pulsing of the plasma power via the ICP coil generator, possibly as explained above with simultaneous use of a magnetic field that is constant over time or pulsed, now the radio-frequency power present at substrate 10 via substrate electrode 11 and produced by substrate voltage generator 12 is also pulsed and these pulsations of plasma power and substrate voltage or of plasma power, substrate voltage, and magnetic field are synchronized with each other in particular.

In particular, pulsing of the pulsed radio-frequency power injected into substrate electrode 11 preferably takes place in such a manner that a radio-frequency power is injected into substrate 10 via substrate voltage generator 12 only during the time of plasma power pulses generated via ICP coil generator 17. For this purpose, for example, one or more radio-frequency power pulses are used with substrate voltage generator 12 during a plasma power pulse, thus at maximum plasma density of positively charged ions and electrons.

As an alternative, the pulsing of the radio-frequency power injected into substrate electrode 11 may, however, take place in such a way that one or more substrate voltage generator pulses are applied only during the interpulse periods of the plasma power pulses. In this case, radio-frequency power injected via the substrate voltage generator is injected at the very point at which the plasma generation is not active, thus at a minimum density of positively charged ions and electrons but a maximum density of negatively charged ions, known as anions, which arise from the recombination of electrons and neutral particles in the excitation pauses in the collapsing plasma. These time phases of a just shut down plasma, the "afterglow regime" of the just shut down plasma, are dominated by recombination processes of electrons and positively charged ions or neutral particles. If in this afterglow regime, the substrate electrode power is activated in the form of one or more pulses, this results in desirable wafer effects in specific applications such as, for example, in the case of a stopped etching on a buried dielectric such as $SiO_2$ with simultaneously high aspect ratios of the produced trenches, the desirable wafer effects being brought about in particular by the increased effect of negatively charged ions which otherwise play practically no role in plasma etching processes. In this connection, a particularly advantageous, special design of this time correlation of plasma power pulses and radio-frequency power pulses injected into substrate electrode 11 is provided in that plasma generation essentially takes place continuously and is interrupted only briefly in each case in order to inject a radio-frequency power pulse into substrate 10 via substrate voltage generator 12 within these brief shutdown pauses of ICP coil generator. On the whole, ICP coil generator 17 is interrupted for brief periods at the repetition frequency of the appearance of the substrate voltage generator pulses for a period of time which is longer, in particular slightly longer, than the pulse duration of the substrate voltage generator pulse. The pulse to pause ratio of ICP coil generator 17 typically amounts in this case to 1:1 to 20:1.

As a function of the specific etching process, there exists a plurality of additional possibilities for the time synchronization or correlation of radio-frequency power pulses injected into substrate 10 via substrate voltage generator 12 and plasma power pulses injected into inductively coupled plasma 14. Accordingly, the substrate voltage generator pulses can be injected both during the plasma power pulses as well as during the plasma power pauses, i.e., a substrate voltage generator pulse is set during each plasma power pulse and an additional substrate voltage generator pulse is set during a plasma power pause. The ratios of the pulse numbers of substrate voltage generator 12 in the "plasma on" and plasma off" phases can to a great extent be freely selected in each individual case.

An additional possibility is to apply the substrate voltage generator pulses only during falling and/or rising pulse edges of the plasma power pulses, i.e., during an incipient afterglow phase or when ramping up plasma production. The particular optimum time correlation of plasma power pulses and substrate voltage generator pulses must be determined in each individual case for the particular etching process or the etched substrate by the person skilled in the art using simple test etchings.

In a very particularly preferred manner, the time synchronization or correlation of the radio-frequency power pulses injected into substrate 10 via substrate voltage generator 17 with the plasma power pulses takes place in such a manner that the pulse duration of the radio-frequency power pulses is set so short that an individual pulse lasts only a few oscillation periods, in particular fewer than ten oscillation periods, of the high-frequency fundamental component of the high-frequency AC voltage generated in the substrate voltage generator.

In particular, a frequency of 13.56 MHz is used for the fundamental component of the radio-frequency power pulses to be injected into the substrate so the duration of one oscillation period of the high-frequency fundamental component amounts to approximately 74 ns. In the case of 10 oscillation periods, the result is a pulse duration of the substrate voltage generator pulses of only 740 ns. Thus, at a repetition frequency of the individual pulses of the substrate voltage generator pulses of, for example, 200 kHz, corresponding to a pulse interval of 5000 ns, and a pulse length of, for example 500 ns, i.e., approximately seven oscillation periods of the high-frequency fundamental component of 13.56 MHz, a pulse to pause ratio of 1:9 is set. Accordingly, in order to attain a radio-frequency power of approximately 20 watts injected into substrate 10 on the time average, a maximum power of the substrate voltage generator of 200 watts is required, which is obtained via correspondingly large radio-frequency amplitudes.

The maximum power of the individual substrate voltage generator pulses may, however, also be far less or far greater and reach up to 1200 watts, for example. The radio-frequency power injected into substrate 10 on the time average then amounts to one-tenth of the particular maximum value of the individual pulses in the example explained.

Both the selected pulse to pause ratio and the maximum value of the power of an individual substrate voltage generator pulse are available as parameters for setting the radio-frequency power injected into substrate 10 on the time average. Therefore, either the maximum power during the substrate voltage generator pulses can be set to a fixed value of, for example, 1 kilowatt and the pulse to pause ratio controlled in such a way that a preset time average of the radio-frequency power is injected into substrate 10, or conversely the pulse to pause ratio can be fixed and the maximum power during the substrate voltage generator pulses can be controlled accordingly so that this time average for power is attained.

To implement this control, a defined setpoint of the radio-frequency power of the machine control of plasma etching system 5 to be injected into substrate 10 as an analog voltage variable is converted into a repetition frequency of individual impulses so that the mean power given off by substrate voltage generator 12 and fed back to the machine control as a time average corresponds exactly to the defined setpoint. In order to translate an analog voltage setpoint into a frequency, voltage-frequency converters or VCOs (voltage controlled oscillators) are used.

The generation of radio-frequency pulses in the specified short-time range using substrate voltage generator 12 is technically relatively non-problematic per se since radio-frequency generators which have a rise and fall time of 30 ns and can manage pulse durations of 100 ns at peak powers of up to several kilowatts are commercially available.

The explained radio-frequency power pulses in the range of several hundred nanoseconds which are injected into substrate 10 and generated using substrate voltage generator 12 are in other respects generated to improve reproducibility in such a way that the radio-frequency signal always appears identical within one individual pulse. For this purpose, for example, three complete high-frequency oscillation periods are always cut out of the 13.56 MHz fundamental component for an individual pulse in such a way that the radio-frequency signal curve always starts with a zero crossing and a rising sine wave at the start of each individual pulse and ends with a zero crossing and also a rising sine wave at the end of the individual pulse.

As an alternative, this synchronization of individual pulse waveform and the waveform of the high-frequency fundamental component may also take place in such a way that a positive sinusoidal half-wave of the high-frequency fundamental component just starts at the start of an individual pulse and a positive sinusoidal half-wave just ends at the end of an individual pulse, i.e., the individual pulse includes one more positive sinusoidal half-wave than negative sinusoidal half-waves. Conversely, by corresponding synchronization under otherwise identical circumstances, one more negative sinusoidal half-wave than positive sinusoidal half-waves can also be placed in an individual pulse by beginning and ending the individual pulse with a negative sinusoidal half-wave of the radio-frequency signal.

Without the explained synchronization, the number of positive and negative sinusoidal half-waves in the generated radio-frequency pulses could be different, differences of up to two sinusoidal half-waves being possible in borderline cases. In particular, with a low number of oscillation periods within one radio-frequency pulse generated via substrate voltage generator 17, this would result in stochastic deviations of the waveforms of the individual pulses and in particular to slowly fluctuating ratios of the number of positive and negative sinusoidal half-waves, which has a negative influence on the reproducibility of the overall etching process.

Figure 5:
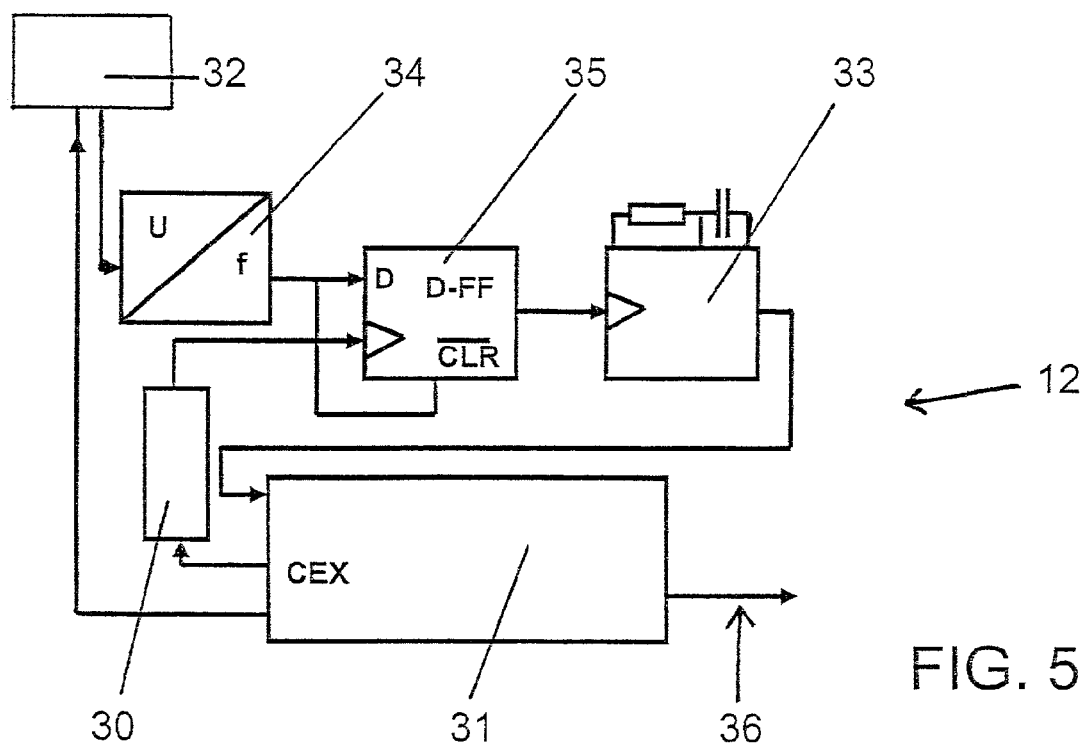
FIG. 5 shows a circuit configuration for the generation of very short radio-frequency power pulses which can be integrated in the substrate voltage generator.

Therefore, in order to ensure that the same high-frequency voltage curve is always present within one individual pulse of substrate voltage generator 12, the electronic circuit explained with the aid of FIG. 5 is preferably implemented in this embodiment additionally integrated with substrate voltage generator 12 for the synchronization of the individual pulses with the high-frequency fundamental component.

In particular, the circuit according to FIG. 5 first provides a control device 32 having an integrated frequency generator which defines a rectangular pulse signal having the frequency with which the individual pulses are to be injected into substrate 10, for example, 200 kHz. As an alternative, however, this repetition frequency may also—with a preselected fixed peak pulse power of substrate voltage generator 12—be derived from the defined setpoint of an average power of the system control of plasma etching system 5 in such a way that the average power given off by substrate voltage generator 12 in the form of individual pulses and returned to the machine control corresponds to the average power defined as the setpoint, which, for example, is attained by a simple voltage-frequency conversion using appropriate calibration.

The square-wave output voltage of the frequency generator of control device 32 is further first converted into an assigned frequency in a voltage-frequency converter 34 which is known per se, and simultaneously applied to the D-input (delay input) and the clear input (CLR input) of a delay flipflop 35. Thus, delay flipflop 35 remains cleared (O-level at Clear) and can also not be set (O-level at D-input) as long as the square-wave voltage has a O-level.

Additionally present at the clock input of delay flipflop 35, via an adjustable phase shifter 30, is an oscillator voltage of a radio-frequency generator 31, which may possibly be suitably conditioned, the radio-frequency generator generating a high-frequency AC voltage of, for example, 13.56 MHz. In commercially available RF generators, this output is identified as the CEX-output (common exciter).

As soon as the square-wave signal of the frequency generator has now switched from 0 to 1, delay flipflop 35 is set each time by the next, subsequent positive sinusoidal half-wave of the radio-frequency AC voltage of RF generator 31 and remains set until the square-wave signal of the frequency generator again switches back from 1 to 0 and resets delay flipflop 35 via the clear input using O-level.

The output of delay flipflop 35 is further connected to the clock input of a monoflop 33 in such a way that when delay flipflop 35 is set, monoflop 33 simultaneously emits an individual pulse, whose pulse duration can be freely selected to a great extent via a resistor-capacitor combination integrated in monoflop 33; in particular, it can be selected to be very small, i.e., smaller than 100 ns. This individual pulse of monoflop 33 is supplied to the pulse input of radio-frequency generator 31 and causes it to emit a radio-frequency output pulse, i.e., a voltage packet comprised of few high-frequency oscillation periods, during the time the individual pulse is applied to generator output 36. Thus the output signal at generator output 36 is always in synchrony with the high-frequency fundamental component of internal radio-frequency generator 31 so that the output signal of substrate voltage generator 12 at output 36, i.e., the substrate voltage generator pulses generated and injected via substrate 10 always have the same appearance.

The described combination of delay flipflop 35 and monoflop 33 guarantees that, for each square-wave period of the frequency generator, only one individual pulse of a preselected duration is generated which is synchronized for the radio-frequency AC voltage of radio-frequency generator 31. Thus substrate voltage generator 12 generates output pulses of a duration that can be set and always have the same waveform, and which are synchronized with the high-frequency fundamental component of radio-frequency generator 31.

Phase shifter 30 between CEX output of radio-frequency generator 31 and the clock input of delay flipflop 34 makes it possible to vary the phase angle of the high-frequency oscillation periods contained in each individual pulse or output pulse of radio-frequency generator 31 within the pulse width. In particular, the phase shifter can thus be adjusted in such a way that the high-frequency oscillation periods of the AC voltage start precisely with the onset of the output pulse of substrate voltage generator 12 and end with the decay of this output pulse so that each output pulse includes precisely one complete number of oscillation periods, i.e., sinusoidal half-waves. In the simplest case, phase shifter 30 is a coaxial cable of a defined length as a delay line. In other respects, the circuit described in FIG. 5 is only exemplary. It can also be replaced by other devices, for example, a synchronous divider which divides the frequency of the oscillator within the generator and derives from it individual pulses and pauses between individual pulses.

The advantageous effect of the radio-frequency power pulses which have a very short duration, in particular, and a high amplitude, used in the above embodiments, and which are injected into substrate 10 via substrate voltage generator 12, is based on the following mechanisms in plasma 14:

As is well-known, a negative DC voltage arises in relation to plasma 14 and in relation to earth potential on a substrate electrode 11 exposed to a plasma 14 to which a high-frequency voltage or a radio-frequency power is applied via substrate voltage generator 12. This DC voltage identified as "bias voltage" or "self-bias" results from the different mobility of electrons and positive ions in the electrical alternating field. While the light electrons instantaneously follow the radio-frequency alternating field and can reach substrate electrode 11 very easily during the positive half-waves of the AC voltage, this is increasingly less possible for the essentially heavier positive ions during the negative half-waves of the AC voltage as the frequency of the electrical alternating field increases. Consequently, a negative charge builds up on substrate electrode 11 through the surplus of arriving electrons in relation to the arriving positive ions until a saturation value of the charge occurs and the same number of electrons as positively charged ions reach substrate electrode 11 on the time average. The substrate electrode voltage corresponds to this saturation value of the negative charge.

Figure 6:
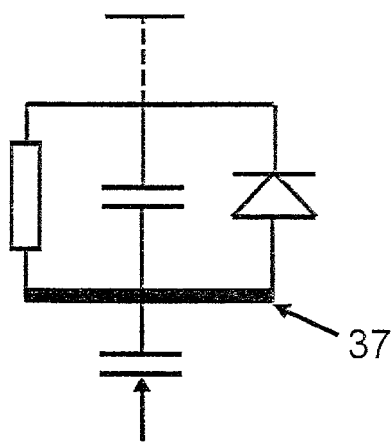
FIG. 6 shows an equivalent circuit diagram for the origination of the substrate electrode voltage.

To explain this effect, FIG. 6 shows a simple equivalent electrical circuit diagram for a substrate electrode surface element 37 exposed to a plasma 14 and supplied with a radio-frequency power from substrate voltage generator 12. The interface to the ground is via plasma 14 which is symbolized by the parallel connection of resistor R and diode D. Diode D takes the effect of the self-rectification by the varying mobility of electrons and ions in plasma 14 into account; resistor R takes the energy dissipation into plasma 14 (equivalent resistance) into account. Capacitance C (reactance) is essentially an instrumental constant of the structure of substrate electrode 11.

With a pulse operation using high-frequency substrate voltage generator pulses, a substrate electrode voltage accordingly builds up at substrate electrode 11 at the start of each pulse, the substrate electrode voltage reaching a saturation value after a number of radio-frequency oscillation periods and persisting there until the end of the pulse. After the end of the radio-frequency oscillation packet, this substrate electrode voltage then decays again during the interpulse period. A typical number of oscillation periods needed to attain a stationary substrate electrode voltage is approximately 20 to 100 oscillation periods at a radio frequency of 13.56 MHz and a high density inductively coupled plasma 14 which is in contact with the substrate electrode.

When very short individual pulses are used, which encompass only a few oscillation periods, preferably fewer than ten oscillation periods, the saturation value of the substrate electrode voltage is still not attained and the substrate electrode voltage is still in the process of rising after the pulse. This is explained in FIG. 7 which shows how the substrate electrode voltage $U_{bias}$ develops as a function of the number of oscillation periods n of the fundamental component of the high-frequency AC voltage (13.56 MHz) injected into substrate 10.

The finally attained level of the local voltage in the saturation case after many oscillation periods is essentially a function of equivalent resistance R (energy dissipation into the plasma) and capacitance C of the capacitor (reactive power component) according to FIG. 6. The saturation value of the substrate electrode voltage, which arises on the substrate surface after many oscillation periods, is thus to a great degree a function of plasma resistance R (see FIG. 6), i.e., of the energy dissipation into plasma 14, which, however, is as a rule laterally non-homogeneous over substrate 10.

Thus local differences occur with regard to the energy dissipation into plasma 14, for example, between the center and edge of a substrate 10, which results in voltage gradients between various surface areas of substrate 10. These voltage gradients are essentially further intensified in that the surface of substrate 10 is electrically insulating at least in some areas during etching or is only weakly conductive as a result of frequently used dielectric masking layers (photoresist, $SiO_2$ mask, etc.).

In this respect, substrate surface 10 no longer shows an equipotential surface due to the explained effects, but rather voltage gradients from the substrate center to the substrate edge have the effect of an electrical lens in relation to plasma 14, which ultimately results in a deflection of the ions accelerated to the substrate from the vertical and accordingly in a fault of the produced etching profiles.

Figure 7:
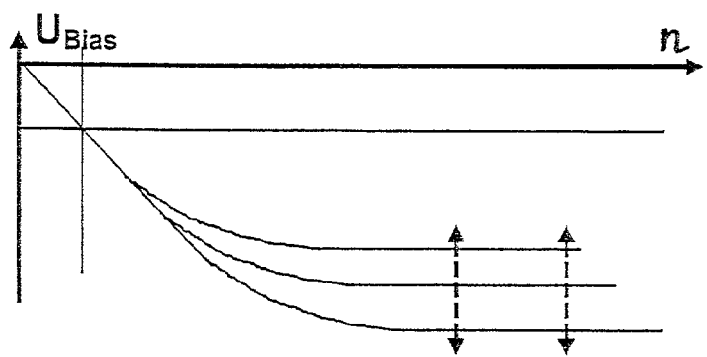
FIG. 7 shows the change in the substrate electrode voltage during a radio-frequency power pulse as a function of the number of the oscillation periods.

The very short substrate electrode power pulses used therefore bring about considerable homogenization of the substrate electrode voltage over the substrate surface independently of locally possibly varying plasma resistances R. This is illustrated in FIG. 7 by the linear waveform in the case of only a small number oscillation periods N. As a whole, the explained measures result in a drastic reduction of voltage gradients on the substrate surface, an elimination of the undesirable electrical lens effect and finally clearly reduced profile slopes, for example in trenches structured out of the substrate.

Moreover, relatively long interpulse periods after each relatively short individual pulse ensure that a previously attained negative substrate electrode voltage is at least to a great degree reduced again. Each substrate electrode power pulse thus starts from a uniform, defined, discharged initial state of the substrate surface.

In other respects, the described pulsing of the substrate electrode power causes only a fraction of the substrate electrode voltage to be reached which would otherwise occur, i.e., on reaching the saturation value after many oscillation periods. If therefore, high or very high substrate electrode voltages of, for example, 20 volts to 100 volts on the time average, are to be implemented, it is necessary to operate with correspondingly high radio-frequency powers during the individual pulses.

LIST OF REFERENCE SYMBOLS 1 frequency-selective component
1' filter characteristic
1" stationary frequency
2 matching network
3 power amplifier
4 quartz oscillator
5 plasma etching system
6 quartz oscillator
7 delay power
8 line
9 Generator control input
9' Generator status output
10 substrate
11 substrate electrode
12 substrate voltage generator
13 ICP source
14 inductively coupled plasma
15 reactor
16 first impedance transformer
17 ICP coil generator
18 second impedance transformer
19 gas supply
20 gas discharge
21 magnetic field coil
22 spacer
23 power supply unit
24 decoupling capacitor
25 signal tap
26 center tap 30 phase shifter
31 radio-frequency generator
32 control device
33 monoflop
34 voltage-frequency converter
35 delay flip-flop
36 generator output
37 substrate electrode surface

What is claimed is:

1. A method for etching a silicon body substrate using a device having an ICP source for generating a radio-frequency electromagnetic alternating field, a reactor for generating an inductively coupled plasma from reactive particles by the action of the radio-frequency electromagnetic alternating field on a reactive gas, and a first means for generating plasma power pulses to be injected into the inductively coupled plasma by the ICP source, comprising:
    matching an impedance of one of an inductive coupled plasma and the ICP source to an ICP coil generator; and
    injecting a pulsed radio-frequency power into the inductively coupled plasma as a pulsed plasma power;
    wherein the pulsing of the injected, pulsed radio-frequency power is accompanied by a change of a frequency of the injected, pulsed radio-frequency power, the change in the frequency being controlled so that the plasma power injected into the inductively coupled plasma during the pulsing is maximized;
    wherein the ICP coil generator causes a variation of the frequency of the radio-frequency electromagnetic alternating field so that the impedance is matched as a function of the pulsed plasma power to be injected, so as to provide rapid switching between the pulses of the pulsed plasma power and interpulse periods;
    wherein the variation of the frequency is automatically performed by a Meissner oscillator feedback loop between the ICP coil and the ICP coil generator input without measuring the ratio of magnitudes of applied and reflected power of the generator.

2. The method according to claim 1, wherein the pulsed plasma power is injected via an ICP source to which a radio-frequency electromagnetic alternating field having a constant frequency or a frequency which varies within a frequency range is applied around a stationary frequency.

3. The method according to claim 1, wherein the pulsed radio-frequency power is generated with an ICP coil generator which is pulse-operated with a frequency of 10 Hz to 1 MHz and pulse to pause ratio of 1:1 to 1:100.

4. The method according to claim 1, wherein a plasma power of 300 watts to 5000 watts on a time average is injected into the inductively coupled plasma and that the generated individual pulse powers of the radio-frequency power pulses are between 300 watts and 20 kilowatts.

5. The method according to claim 4, wherein the radio-frequency power pulses are between 2 kilowatts to 10 kilowatts.

6. The method according to claim 1, wherein during the etching, one of a static and time-variable magnetic field is generated, the direction of which is at least one of approximately and predominantly parallel to a direction defined by the connecting line of the substrate and the inductively coupled plasma.

7. The method according to claim 6, wherein the magnetic field is generated in such a way that it extends into the area of the substrate and the inductively coupled plasma and has a field strength amplitude between 10-mTesla and 100 mTesla in the interior of the reactor.

8. The method according to claim 6, wherein a magnetic field pulsed at a frequency of 10 Hz to 20 kHz is generated via the power supply unit, the pulse to pause ratio when the magnetic field is pulsed being between 1:1 and 1:100.

9. The method according to claim 6, wherein one of the static and time-variable magnetic field is one of periodically varying and pulsed magnetic field.

10. The method according to claim 1, wherein a time-variable radio-frequency power is applied to the substrate via a substrate voltage generator.

11. The method according to claim 10, wherein the pulse duration of the radio-frequency power injected into the substrate is between one to one hundred times the period of oscillation of the high-frequency fundamental component of the radio-frequency power.

12. The method according to claim 11, wherein the frequency of the injected radio-frequency power is between 100 kHz to 100 MHz and a pulse-to-pause ratio of the injected radio-frequency pulses is between 1:1 and 1:100.

13. The method according to claim 12, wherein the frequency of the injected radio-frequency power is 13.56 MHz.

14. The method according to claim 12, wherein the pulse-to-pause ratio of the injected radio-frequency pulses is between 1:1 and 1:10.

15. The method according to claim 11, wherein the pulse duration is between one to ten times.

16. The method according to claim 10, wherein the radio-frequency power applies a time-average power of 5 watts to 100 watts to the substrate, a maximum power of an individual radio-frequency power pulse being one to 20 times the time average power.

17. The method according to claim 16, wherein the maximum power of an individual radio-frequency power pulse is between twice to 10 times the time average power.

18. The method according to claim 10, wherein one of the constant and time-variable radio frequency power is a pulsed, radio-frequency power.

19. The method according to claim 10, wherein a pulse duration of the radio-frequency power injected into the substrate is between one to ten times a period of oscillation of the high-frequency fundamental component of the radio-frequency power.

20. The method according to claim 1, wherein the pulsing of the injected plasma power and one of a pulsing of the radio-frequency power injected into the substrate via the substrate voltage generator and a pulsing of a magnetic field, the pulsing of the injected plasma power and the pulsing of the radio-frequency power injected into the substrate via the substrate voltage generator are one of time-correlated and synchronized with each other.

21. The method according to claim 20, wherein the correlation takes place in such a way that the magnetic field is first applied, before a radio-frequency power pulse of the ICP coil generator, and the magnetic field is switched off again after the decay of this radio-frequency power pulse.

22. The method according to claim 20, wherein the correlation takes place in such a way that during a radio-frequency power pulse of the ICP coil generator, the radio-frequency power injected into the substrate via the substrate voltage generator is switched off and/or that during a radio-frequency power pulse injected into the substrate via the substrate voltage generator, the radio-frequency power injected via the ICP coil generator is switched off.

23. The method according to claim 20, wherein the synchronization takes place in such a way that during each time of a plasma power pulse injected into the plasma via the ICP coil generator, radio-frequency pulses injected into the substrate via the substrate voltage generator are also applied to the substrate.

24. The method according to claim 20, wherein the correlation takes place in such a way that the radio-frequency power injected into the substrate via the substrate voltage generator is generated in each case during a power rise and/or a power drop of a radio-frequency power pulse injected into the plasma via the ICP coil generator.

25. The method according to claim 20, wherein the correlation takes place in such a way that during the time of the plasma power pulses injected into the plasma via the ICP coil generator and during the time of the pulse pauses between the individual plasma power pulses injected into the plasma via the ICP coil generator, at least one radio-frequency power pulse injected into the substrate via the substrate voltage generator is applied to the substrate in each case.

26. The method according to claim 1, wherein the etching takes place in alternating etching and passivation steps at a process pressure of 5 μbar to 100 μbar.

27. The method according to claim 1, wherein the pulsed plasma power is in a kilowatt range.

28. The method according to claim 1, wherein the pulsed plasma power is above 3 kilowatts.

29. The method according to claim 1, wherein the ICP coil generator includes integrated components.

30. The method according to claim 1, wherein a constant radio-frequency power is applied to the substrate via a substrate voltage generator.

* * * * *